United States Patent [19]

Matthews

[11] Patent Number: 4,548,688

[45] Date of Patent: Oct. 22, 1985

[54] HARDENING OF PHOTORESIST

[75] Inventor: John C. Matthews, Columbia, Md.

[73] Assignee: Fusion Semiconductor Systems, Rockville, Md.

[21] Appl. No.: 497,466

[22] Filed: May 23, 1983

[51] Int. Cl.$^4$ ............................................. B32B 27/16
[52] U.S. Cl. ........................... 204/159.18; 204/159.14; 430/325; 430/326; 430/330
[58] Field of Search ........................ 430/153, 330, 348; 204/158, 159.11, 159.14, 159.16, 159.17, 159.19, 159.2, 159.18

[56] References Cited

U.S. PATENT DOCUMENTS

| | | | |
|---|---|---|---|
| 3,415,648 | 12/1968 | Certa | 96/36 |
| 3,549,366 | 12/1970 | Margerum | 96/35.1 |
| 3,623,870 | 11/1971 | Curran et al. | 96/49 |
| 4,130,426 | 12/1978 | Takeda et al. | 430/151 |
| 4,264,712 | 4/1981 | Kress | 430/302 |
| 4,429,034 | 1/1984 | Keane et al. | 204/159.18 |
| 4,439,516 | 3/1984 | Cernigliaro et al. | 430/323 |

FOREIGN PATENT DOCUMENTS

| | | |
|---|---|---|
| 54-92808 | 7/1979 | Japan . |
| 55-102467 | 8/1980 | Japan . |
| 55-102468 | 8/1980 | Japan . |
| 55-102469 | 8/1980 | Japan . |
| 55-102470 | 8/1980 | Japan . |
| 55-103722 | 8/1980 | Japan . |
| 55-103721 | 8/1980 | Japan . |
| 58-8573 | 1/1983 | Japan . |
| 58-125354 | 8/1983 | Japan . |
| 58-223340 | 12/1983 | Japan . |
| 861871 | 3/1961 | United Kingdom . |
| 974837 | 11/1964 | United Kingdom . |
| 1103865 | 2/1968 | United Kingdom . |
| 1170495 | 11/1969 | United Kingdom . |
| 1492620 | 11/1977 | United Kingdom . |
| 2019593 | 10/1979 | United Kingdom . |

Primary Examiner—Howard S. Williams
Attorney, Agent, or Firm—Pollock, Vande Sande & Priddy

[57] ABSTRACT

Photoresist is hardened by exposing it to UV radiation while subjecting it to elevated temperatures upon an increase in the degree of polymerization due to exposure to the radiation. The temperature of the photoresist can be controlled by a thermal chuck which contains a thermal ballast of heat conducting material.

10 Claims, 3 Drawing Figures

CONDITION "1" – RESIST IS MAINTAINED AT AMBIENT TEMPERATURE DURING THE EXPOSURE.

CONDITION "2" – RESIST IS MAINTAINED AT A CONSTANT ELEVATED TEMPERATURE BELOW THE INITIAL RESIST FLOW TEMPERATURE DURING THE EXPOSURE.

CONDITION "3" – RESIST TEMPERATURE IS ALLOWED TO RISE DURING UV EXPOSURE, BUT IS MAINTAINED BELOW THE FLOW TEMPERATURE OF THE RESIST. FINAL RESIST TEMPERATURE EXCEEDS INITIAL FLOW TEMPERATURE OF THE RESIST.

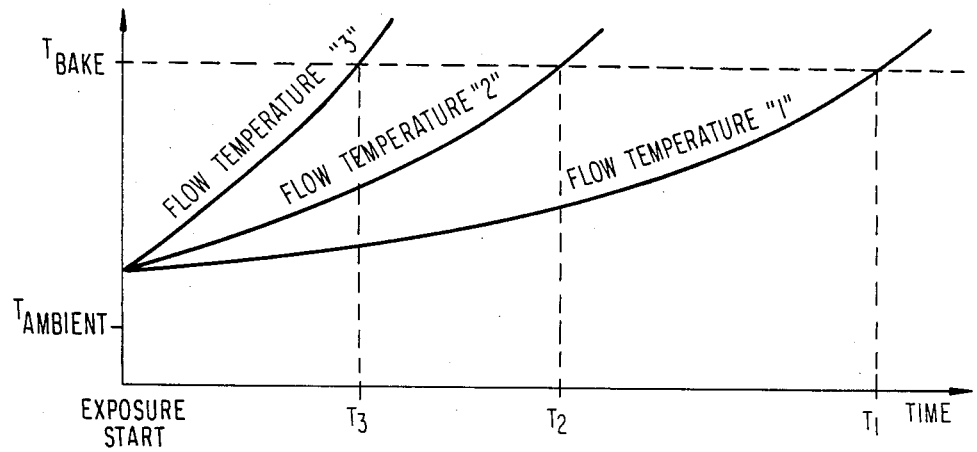

CONDITION "1" – RESIST IS MAINTAINED AT AMBIENT TEMPERATURE DURING THE EXPOSURE.

CONDITION "2" – RESIST IS MAINTAINED AT A CONSTANT ELEVATED TEMPERATURE BELOW THE INITIAL RESIST FLOW TEMPERATURE DURING THE EXPOSURE.

CONDITION "3" – RESIST TEMPERATURE IS ALLOWED TO RISE DURING UV EXPOSURE, BUT IS MAINTAINED BELOW THE FLOW TEMPERATURE OF THE RESIST. FINAL RESIST TEMPERATURE EXCEEDS INITIAL FLOW TEMPERATURE OF THE RESIST.

FIG. 3

HARDENING OF PHOTORESIST

DESCRIPTION

1. Technical Field

The present invention is concerned with a method and apparatus for hardening of photoresist materials. In particular, the present invention is directed to an improved method for hardening positive photoresist material employing UV radiation and especially deep to mid UV radiation. The present invention is particularly advantageous in the fabrication of integrated circuits. The present invention is also concerned with a device capable of controlling the temperature of the photoresist during exposure to UV radiation.

2. Background Art

In the fabrication of various articles, it is often necessary to protect preselected areas of the surface while other areas of that same surface are exposed to particular treatments and/or process procedures. For instance, in the fabrication of semiconductor devices wherein, for example, an oxide layer is formed on a semiconductor substrate, it is often necessary to remove selected portions of the oxide layer so as to allow diffusion of a suitable impurity through the oxide layer openings into the underlying semiconductor substrate. Exemplary of such procedures is the fabrication of semiconductor devices, such as single crystal field effect transistors.

The above type of devices are formed by vapor diffusing a suitable impurity into a wafer of a single silicon crystal to form suitably doped regions therein. In order to provide distinct P or N regions which are necessary for the proper operation of the device, diffusion should occur through only a limited portion of the substrate. Usually, this is accomplished by masking the substrate with a diffusion resistant material, such as silicon dioxide, which is formed into a protective mask to prevent diffusion through preselected areas of the substrate.

The silicon dioxide mask is typically provided by forming a uniform oxide layer over the wafer substrate and thereafter creating a series of openings through the oxide layer to allow the passage of the impurity directly into the underlying surface within a limited area. These openings are readily created by coating the silicon dioxide with a material known as a photoresist. Photoresists can be negative photoresist or positive photoresist materials. A negative photoresist material is one which is capable of polymerizing and insolubilizing on exposure to light. Accordingly, when employing a negative photoresist material, the photoresist layer is selectively exposed to light, causing polymerization to occur above those regions of the silicon dioxide which are intended to be protected during a subsequent operation. The unexposed portions of the photoresist are removed by a solvent which is inert to the polymerized portion of the resist and a suitable etchant for the silicon dioxide, such as hydrogen fluoride or plasma is applied to remove the unprotected oxide regions.

The positive resist material is one that upon exposure to light is capable of being rendered soluble in a solvent in which the unexposed resist is not soluble. Accordingly, when employing a positive photoresist material, such is selectively exposed to light, causing reaction to occur above those regions of the silicon oxide which are not intended to be protected during the subsequent processing. The exposed portions of the photoresist are removed by a solvent which is not capable of dissolving the unexposed portion of the resist. Then the silicon dioxide is etched to remove the unprotected oxide regions.

Likewise, photoresist materials are used to define other regions of such devices such as polycrystalline silicon regions and metallic type interconnections.

Many of the commonly used photoresists are not especially resistant to flow or distortion when exposed to relatively high temperatures encountered in more recently employed processing techniques such as plasma etching. In addition, it is desired to use the photoresist remaining after defining for instance the oxide regions, in many applications as a protecting layer in the processing such as the doping. This also exposes the photoresist to elevated temperatures including that above about 200° C.

In order to be suitable for such purposes, materials which are resistant to flow at higher temperatures have been developed and used as photoresists. In addition, it has been suggested to subject certain positive photoresists to exposure to deep UV radiation to cross-link and stabilize the material against elevated temperatures after the pattern in the photoresist has been developed. Examples of such discussions of the use of deep UV radiation to cure or cross-link positive photoresists can be found in Yen, et al., Deep UV and Plasma Hardening of Positive Photoresist Patterns, Integrated Circuit Laboratory, Xerox Palo Alto Research Center, Palo Alto, Calif. Hiraoka, et al., High Temperature Flow Resistance of Micron Sized Images in AZ Resists, AZ Resists, Vol. 128, No. 12, pages 2645-2647; and Ma, Plasma Resist Image Stabilization Technique (PRIST) update, SPIE Vol. 333, Submicron Lithography, 1982, pages 1-23.

The use of deep UV radiation for such stabilization is not entirely satisfactory since the time of exposure for many of the commonly used photoresists has been reported as being about 10-30 minutes, which is relatively long.

SUMMARY OF THE INVENTION

The present invention provides a process for hardening positive photoresist materials by UV radiation which makes it possible to significantly reduce the necessary exposure time. For instance, the present invention makes it possible to effect stabilization of many positive photoresists using exposure times for UV radiation containing wavelenghts of up to 320 nm of less than one minute. In addition, the present invention makes it possible, in many instances, to eliminate postbaking or to postbake at higher temperatures and/or shorter times.

In particular, the present invention is concerned with hardening a positive photoresist by exposing a film of photoresist material to UV radiation while subjecting the film to elevated temperatures upon an increase in the degree of polymerization of the photoresist due to exposure to the UV radiation. The elevated temperature is maintained below the flow temperature of the film. The flow temperature as used herein refers to that temperature which causes the photoresist to distort when applied to the photoresist for 30 minutes. The resist during the exposure to the UV radiation is heated to an elevated temperature which is greater than the flow temperature of the photoresist at the start of the exposure to the UV radiation.

The present invention is also concerned with a thermal chuck for use in the above described process to control the temperature of the photoresist during exposure to UV radiation. The thermal chuck contains a thermal ballast which supports the substrate and which is composed of a thermally conductive material for transferring heat during exposure to the light to and from the substrate and photoresist. The mass of the thermal ballast is selected so that the temperature of the photoresist is raised above the flow temperature of the photoresist which existed at the start of the exposure to the UV radiation, but below the flow temperature of the photoresist at the time the temperature is raised.

The present invention is also concerned with apparatus for hardening a photoresist which comprises the thermal chuck described hereinabove and a lamp capable of emitting UV radiation and heat.

BRIEF DESCRIPTION OF THE DRAWINGS

FIG. 3 is a graph illustrating flow temperature versus exposure time for different temperature conditions during exposure to UV radiation.

DESCRIPTION OF PREFERRED AND VARIOUS MODES FOR CARRYING OUT INVENTION

A wide variety of photoresist materials can be employed in the process of the present invention. Among those photoresist materials found to be especially suitable are the positive photoresists which are cross-linkable when exposed to UV radiation of up to 320 nm, and particularly, those photoresists sensitized with diazo compounds. Examples of such diazo sensitizers are discussed on pages 48–55 of DeForest, *Photoresist Materials and Processes,* McGraw-Hill Book Company, 1975, disclosure of which is incorporated herein by reference. Some diazo compounds are benzoquinone 1,2-diazide-4-sulfochloride; 2-diazo-1-naphthol-5-sulphonic acid ester; naphthoquinone-1,2-diazide-5-sulfochloride; naphthoquinone-1,2-diazide-4-sulfochloride; naphthoquinone-2,1-diazide-4-sulfochloride; and naphthoquinone 2,1-diazide-5-sulfochloride.

The preferred photoresist materials employed are the phenolic-formaldehyde type novolak polymers sensitized with a diazo compound. The phenols include phenol and substituted phenols such as cresol. A particular example of such is Shipley 1350 which is an m-cresol-formaldehyde novolak polymer composition. Such is a positive resist composition and includes therein a diazoketone, such as 2-diazo-1-naphthol-5-sulphonic acid ester. In such a composition, the ortho-diazoketone during the photochemical reaction is converted to a carboxylic acid. Other commercially available photoresists are suitable for carrying out the process of the present invention, including other novolak types.

The UV radiation employed must contain sufficient dosage of deep to mid UV radiation having wavelengths about 320 nm and below to cause the polymer to cross-link; preferably about 180 to 320 nm and more usually, about 190–260 nm. In many instances, the dosage to the photoresist of the UV radiation of wavelength of 320 nm and below is at least about 10 Joule/cm$^2$.

Figure 2:
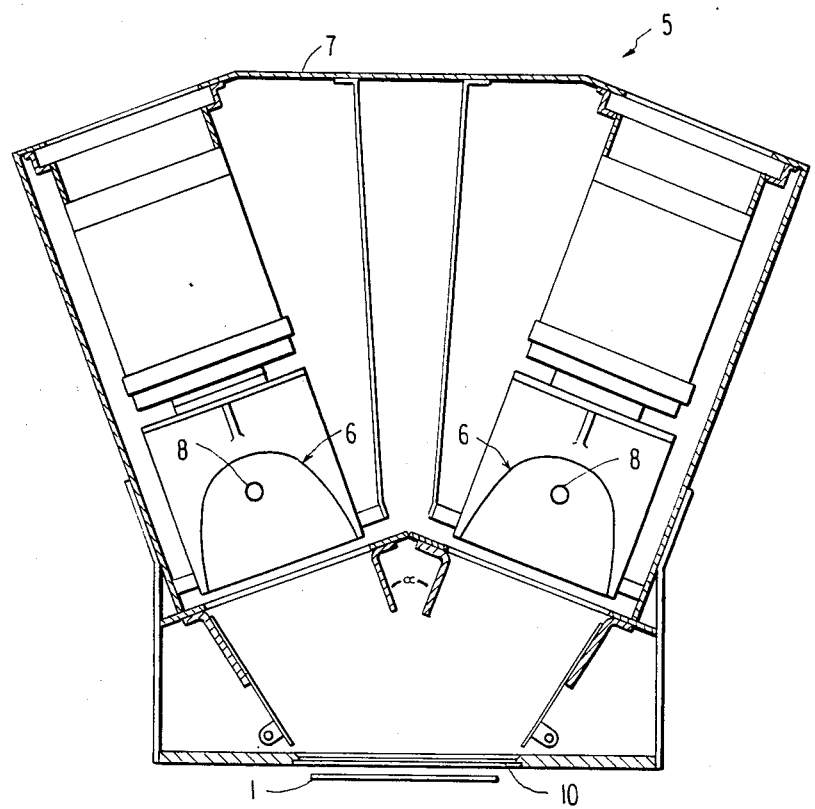
FIG. 2 is a schematic diagram of a lamp suitable for supplying UV radiation for use in the present invention.

Although the present invention can be carried out with any deep UV output lamp, a particularly suitable lamp is schematically illustrated as numeral 5 in FIG. 2. This lamp 5 in addition to providing the necessary deep to mid UV radiation, also emits IR irradiation sufficient to supply the necessary heat to the photoresist for carrying out the process of the present invention. Lamp 5 is a microwave powered electrodeless lamp comprising two separate microwave powered electrodeless lamps 6 having an elongated lamp envelope 8 within housing 7. Since the lamps are fully described in U.S. patent application Ser. No. 393,856 to Ury, et al., filed June 30, 1982 now U.S. Pat. No. 4,504,768, entitled "Electrodeless Lamp Using a Single Magnetron and Improved Lamp Envelope Therefore", disclosure of which is incorporated herein by reference; a more detailed discussion thereof is not deemed necessary. The basic difference between the disclosure of Ser. No. 393,856 and the lamp illustrated in FIG. 2 is that two separate individually microwave powered lamps 6 are contained in housing 7 as contrasted to one such lamp explicitly described in said Ser. No. 393,856. The lamps 6 are at α angle of about 19°–20° to each other. The lamps include an elongated envelope and elliptical reflector as described in Ser. No. 393,856. Two lamps are employed in this embodiment merely as a precaution to insure uniform irradiation of the wafer and photoresist. However, as understood, any lamp capable of providing the needed irradiation can be used.

A lamp as disclosed is available from Fusion Semiconductor Systems Corporation, a subsidiary of Fusion Systems Corporation under the trademark "Microlite 126A Resist Stabilizer Unit".

The exposure time required is significantly reduced according to the present invention by maintaining the resist at an elevated temperature during the exposure to the UV radiation. The temperature must be below the flow temperature of the resist which would cause deformation or distortion of the coating or of any pattern therefrom. Although the photoresist need not be subjected to elevated temperatures throughout the exposure to the radiation, it is preferred that elevated temperatures be used during at least substantially the entire exposure to radiation. During the exposure to the radiation the photoresist is heated to elevated temperature which is above the flow temperature of the resist at the start of the exposure to the radiation.

The flow temperature of the photoresist steadily increases throughout the duration of the radiation as result of an increase in the degree of polymerization or cross-linking of the photoresist. Accordingly, the temperature to which the photoresist can be heated without distortion increases as the cross-linking or polymerization due to the radiation procedes.

In a preferred embodiment of the present invention, the temperature of the photoresist is controlled during the exposure to radiation so that it rises at approximately the same rate as does the flow temperature while insuring that the temperature of the photoresist never equals or exceeds the flow temperature. The exposure is continued until the flow temperature exceeds the desired hard bake temperature of the photoresist.

Another embodiment of the invention involves a two-step process which includes a first step of exposing the photoresist to said UV irradiation at a temperature below the flow temperature of the unexposed resist, and a second step of exposing the resist to said UV irradiation at a temperature substantially exceeding the flow temperature of the unexposed photoresist. If desired, the source of the UV irradiation of the first step can differ from that of the UV irradiation of the second step.

When used in the fabrication of integrated circuits, the photoresist is usually applied in thicknesses of 10,000 angstroms to about 20,000 angstroms.

The diazo-sensitized phenolic-formaldehyde type photoresist of the type referred to hereinabove are usually heated to at least about 100° C., preferably at least about 120° C., and most preferably, to at least about 200° C. in practicing the present invention. A typical range therefor being about 100°–200° C. and more usually, about 120° to about 200° C. Of course, the particular preferred temperature will depend upon the specific photoresist and thickness of the film employed.

Figure 1:
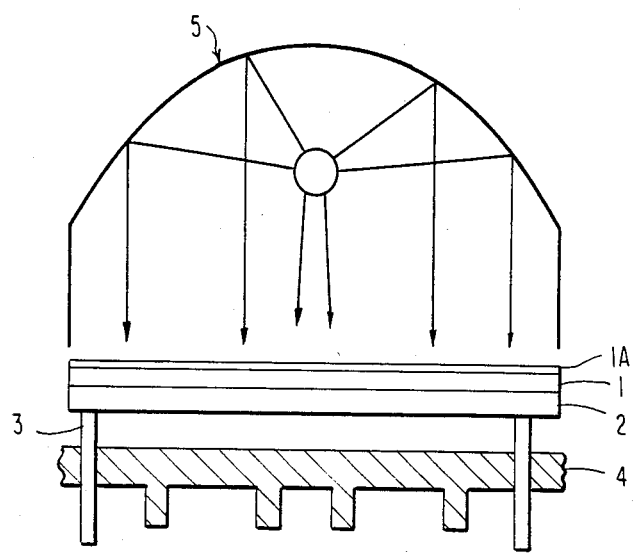
FIG. 1 is a schematic diagram of apparatus suitable for carrying out the present invention.

Reference to FIG. 1 schematically illustrates apparatus suitable for carrying out the present invention. In particular, as discussed hereinabove, numeral 5 refers to the lamp system which supplies the UV irradiation of up to 320 nm and the IR irradiation for heat to the photoresist 1A and wafer 1 located beneath the output of the lamp at the quartz plate 10. For a typical application of a wafer having a diameter of about 2 to 6 inches with a resist thickness of about 10,000 to about 20,000 angstroms thereon, the distance between the wafer-resist combination from the output of the lamp at the quartz plate 10 is about one-eighth inch. The wafer and resist are supported by a thermal ballast 2.

The material and mass of the thermal ballast 2 is selected so that the rise in the temperature of the photoresist due to heat from the lamp which will be supplied to the photoresist 1A and the thermal ballast 2 will be such as to raise the temperature of the photoresist 1A above the flow temperature of the photoresist which existed at the start of the exposure to the radiation, but below the flow temperature of the photoresist 1A at the time the temperature is raised.

The heat ballast 2 acts to transfer heat both to and from wafer 1. In particular, heat ballast 2 is preheated to about 100°–120° C. to transfer heat to wafer 1 prior to and at the start of the exposure to the UV radiation. As the exposure to the UV radiation proceeds, heat ballast 2 actually removes heat from the wafer to prevent the temperature from exceeding the flow temperature.

The thermal ballast 2 is a material capable of conducting heat such as a metal or metal alloy.

Examples of such materials are aluminum and stainless steel. The mass of the thermal ballast 2 should usually be at least as large as that of the wafer 1 and in many instances, up to about 30 times the mass of the wafer 1. In a typical application the thermal ballast is about one-eighth to about one-sixteenth of an inch thick having a diameter of about 2 to about 6 inches corresponding to the diameter of the wafer and weighing about 50 to about 100 grams. If desired, a vacuum (not shown) can be applied to the thermal ballast 2 in order to assure intimate contact between the wafer and ballast. A vacuum can be applied by providing small grooves in the top surface of the thermal ballast 2 and connecting a vacuum source via lines attached through the back of the thermal ballast 2. The exact mechanism by which the wafer is secured and positioned, if desired, has not been shown since there are many techniques in the prior art in which to accomplish such.

Moreover, although this embodiment illustrates supplying the heat from the lamp itself and using a thermal ballast, there are other methods in which heat can be supplied to the photoresist other than the lamp such as supplying heat to the support 2 by external means and employing a control to raise the temperature to the desired level after exposure to the light for a predetermined period of time. However, the means disclosed herein provides a very convenient and relatively simple means to automatically control the temperature of the photoresist within the desired limits. The temperature to be employed for any particular photoresist at any particular thickness after exposure for any length of time can be determined by determining the flow temperature of such from previous testing without undue experimentation.

The thermal ballast as employed will limit the temperature rise automatically by drawing away a certain amount of heat due to the particular mass of the ballast and the amount of time in which the ballast is exposed to the infrared light from the lamp. Accordingly, by selecting the material and mass as mentioned hereinabove, the temperature rise of the wafer and photoresist can be readily regulated within the desired limits. Although the presence of non-heat conductors on the wafer such as silicon dioxide may have some effect on the transfer of heat, the films are so thin that the effect would be minimal as contrasted to the predominant effects caused by the heat source and heat reflective capacity of the heat ballast 2.

Extending downward from the thermal ballast 2 are insulating stand-offs or pins 3 which extend into and through heat sink 4. The pins 3 at their lower end can be connected to mechanical arrangement (not shown) to move the pins and in turn, thermal ballast 2 away from or in contact with heat sink 4. The pins can be made of a non-heat conductor and non-reflector such as quartz. Upon completion of the exposure, the wafer and photoresist is removed from a thermal ballast 2 and thermal ballast 2 is then contacted by manually moving pins 3 down into heat sink 4 to thereby have the thermal ballast 2 contact heat sink 4 in order to cool thermal ballast 2 back down to about 100° C. or less. Heat sink 4 can also be made of a heat conducting material such as aluminum or stainless steel and readily removes heat from the heat ballast 2. Heat sink 4 can be cooled by supplying cool air or other cooling media thereto. At this point, a new wafer can be applied to the thermal ballast 2 and then the thermal ballast 2 can be moved by manually moving the pins 3 upward in order to disengage contact with the heat sink 4 and in position for exposure to the light.

Reference to FIG. 3 illustrates the relative times required to obtain a T bake or stabilization for 200° C. for positive photoresists of the type discussed hereinabove. Curve 1 illustrates the values for the condition wherein the resist is maintained at normal ambient temperatures of about 20°–40° C. during the exposure. The temperatures are kept at this level by not employing the heat ballast, but instead, just using the wafer on the heat sink 4.

Curve 2 illustrates the values for the resist which is maintained at a temperature of about 100°–120° C. during the exposure. These temperatures are not above the flow temperature of the resist at the start of the exposure. The temperature is maintained at this level by not employing the heat ballast, but using the heat sink as for Curve 1 and preheating the sink to about 100° C. before exposure.

Curve 3 illustrates conditions wherein the temperature of the resist is permitted to rise during the exposure to UV, but maintained below the flow temperature of the resist. The final resist temperature is 200° C. which is above the initial flow temperature of the resist.

Using the arrangement illustrated in FIG. 1 with HPR 204 from Phillip A. Hunt (a Novolak type) photoresist at thickness of about 14,000 angstroms on a 4" diameter wafer, an aluminum thermal ballast of 4" diameter, the following results are obtained for the following conditions:

|  | Photoresist Temperature | Time to Stabilize |
| --- | --- | --- |
| No thermal ballast, heatsink at ambient | 20–40° C. | 90 sec. |
| No thermal ballast, preheat heatsink to 100° C. | 100–120° C. | 50 sec. |
| 4" thermal ballast ⅛" thick, 67 grams aluminum | 100–180° C. | 30 sec. |

The above illustrates that the procedure of the present invention significantly reduces the time required to subject the photoresist to exposure to UV radiation.

What is claimed is:

1. A method of hardening a positive photoresist which comprises exposing a film of positive photoresist material to UV radiation containing sufficient dosage of wavelengths of about 320 nm or below to cause said photoresist to harden while subjecting the film to elevated temperature upon increase in the degree of polymerization due to exposure to said UV radiation wherein said elevated temperature, at any instant during the said exposing, is below the flow temperature of the film at the particular instant, and wherein the resist is subjected to elevated temperature during the exposure to the UV radiation which is greater than the initial flow temperature of the resist at the start of the exposure to the UV radiation, and to thereby harden said positive photoresist.

2. The method of claim 1 wherein said UV radiation contains wavelengths of about 180–320 nm.

3. The method of claim 1 wherein said UV radiation has wavelengths of about 190–260 nm.

4. The method of claim 1 wherein said elevated temperature is above about 100° C.

5. The method of claim 1 wherein said photoresist is a diazo sensitized polymer composition.

6. The method of claim 5 wherein said polymer is a phenolic-formaldehyde novalak type.

7. The method of claim 1 wherein said elevated temperature is above about 120° C.

8. The method of claim 1 wherein the photoresist is heated to elevated temperature of about 200° C.

9. The method of claim 1 wherein the film of positive photoresist material is about 10,000 to about 20,000 angstroms.

10. The method of claim 1 which further comprises controlling the temperature of the photoresist during the exposure to radiation so that it rises at approximately the same rate as does the flow temperature while insuring that the temperature of the photoresist never equals or exceeds the flow temperature.

* * * * *